(12) United States Patent
Werber et al.

(10) Patent No.: US 9,018,674 B2
(45) Date of Patent: Apr. 28, 2015

(54) REVERSE CONDUCTING INSULATED GATE BIPOLAR TRANSISTOR

(75) Inventors: Dorothea Werber, Munich (DE); Anton Mauder, Kolbermoor (DE); Frank Pfirsch, Munich (DE); Hans-Joachim Schulze, Taufkirchen (DE); Franz Hirler, Isen (DE); Alexander Philippou, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/441,364

(22) Filed: Apr. 6, 2012

(65) Prior Publication Data

US 2013/0264607 A1  Oct. 10, 2013

(51) Int. Cl.
*H01L 29/739* (2006.01)
*H01L 29/06* (2006.01)
*H01L 29/08* (2006.01)

(52) U.S. Cl.
CPC ........ *H01L 29/7396* (2013.01); *H01L 29/0696* (2013.01); *H01L 29/0834* (2013.01)

(58) Field of Classification Search
CPC ....... H01L 29/739; H01L 29/74; H01L 29/94; H01L 29/10; H01L 29/76
USPC .................. 257/328, 124, E29.198–E29.211
See application file for complete search history.

(56) References Cited

U.S. PATENT DOCUMENTS

| | | | |
|---|---|---|---|
| 2007/0120181 A1* | 5/2007 | Ruething et al. | 257/328 |
| 2010/0276727 A1 | 11/2010 | Storasta et al. | |
| 2011/0018029 A1* | 1/2011 | Pfirsch et al. | 257/147 |
| 2011/0254050 A1* | 10/2011 | Udrea et al. | 257/140 |
| 2011/0278694 A1* | 11/2011 | Rahimo et al. | 257/497 |
| 2012/0068263 A1* | 3/2012 | Hefner et al. | 257/335 |

FOREIGN PATENT DOCUMENTS

| | | |
|---|---|---|
| DE | 10245050 B4 | 9/2005 |
| EP | 1271653 B1 | 7/2009 |
| JP | 2011114027 A | 6/2011 |
| WO | 02063695 A1 | 8/2002 |
| WO | 2010052245 A2 | 5/2010 |

OTHER PUBLICATIONS

Jiang, et al., "A Snapback Suppressed Reverse-Conducting IGBT With a Floating p-Region in Trench Collector", IEEE Electron Device Letters, Mar. 3, 2012, 417-419.

(Continued)

*Primary Examiner* — Marc Armand
*Assistant Examiner* — Quinton Brasfield
(74) *Attorney, Agent, or Firm* — Murphy, Bilak & Homiller, PLLC

(57) ABSTRACT

A semiconductor includes a drift zone of a first conductivity type arranged between a first side and a second side of a semiconductor body. The semiconductor device further includes a first region of the first conductivity type and a second region of a second conductivity type subsequently arranged along a first direction parallel to the second side. The semiconductor device further includes an electrode at the second side adjoining the first and second regions. The semiconductor device further includes a third region of the second conductivity type arranged between the drift zone and the first region. The third region is spaced apart from the second region and from the second side.

21 Claims, 5 Drawing Sheets

(56) References Cited

OTHER PUBLICATIONS

L. Storasta, et al. "The Radial Layout Design Concept for the Bi-mode Insulated Gate Transistor." Proceedings of the 23rd International Symposium on Power Semiconductor Devices & IC's. May 23-26, 2011. pp. 56-59. IEEE. San Diego, CA.

M. Rahimo, et al. "The Bi-mode Insulated Gate Transistor (BIGT) A Potential Technology for Higher Power Applications." 2009. pp. 283-286. IEEE. Switzerland.

M. Rahimo, et al. "A High Current 3300V Module Employing Reverse Conducting IGBTs Setting a New Benchmark in Output Power Capability." Proceedings of the 2oth International Symposium on Power Semiconductor Devices & IC's. May 18-22, 2008. pp. 68-71. IEEE. Orlando, FL.

* cited by examiner

REVERSE CONDUCTING INSULATED GATE BIPOLAR TRANSISTOR

BACKGROUND

Reverse conducting semiconductor devices, e.g. Reverse Conducting Insulated Gate Bipolar Transistors (RC IGBTs), allow to operate in a transistor mode, e.g. IGBT mode, and in a diode mode, e.g. freewheeling diode mode, by using a same active area in a semiconductor body. During design of reverse conducting semiconductor devices, trade-offs between electrical characteristics in diode and transistor modes have to be considered, e.g. trade-offs between forward characteristics, robustness and softness.

It is desirable to design reverse conducting semiconductor devices including an improved trade-off between the electrical characteristics in a diode mode and in a transistor mode.

SUMMARY

According to an embodiment of a semiconductor device, the semiconductor includes a drift zone of a first conductivity type arranged between a first side and a second side of a semiconductor body. The semiconductor device further includes a first region of the first conductivity type and a second region of a second conductivity type subsequently arranged along a first direction parallel to the second side. The semiconductor device further includes an electrode at the second side adjoining the first and second regions. The semiconductor device further includes a third region of the second conductivity type arranged between the drift zone and the first region. The third region is spaced apart from the second region and from the second side.

According to an embodiment of a RC IGBT, the RC IGBT includes a drift zone of a first conductivity type arranged between an emitter side and a collector side of a semiconductor body. The RC IGBT further includes a first emitter region of the first conductivity type and a second emitter region of a second conductivity type subsequently arranged along a first direction parallel to the second side. The RC IGBT further includes an electrode at the second side adjoining the first and second emitter regions. The RC IGBT further includes a third region of the second conductivity type arranged between the drift zone and the first region. The third region is spaced apart from the second emitter region and from the second side.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

DETAILED DESCRIPTION

Figure 1A:
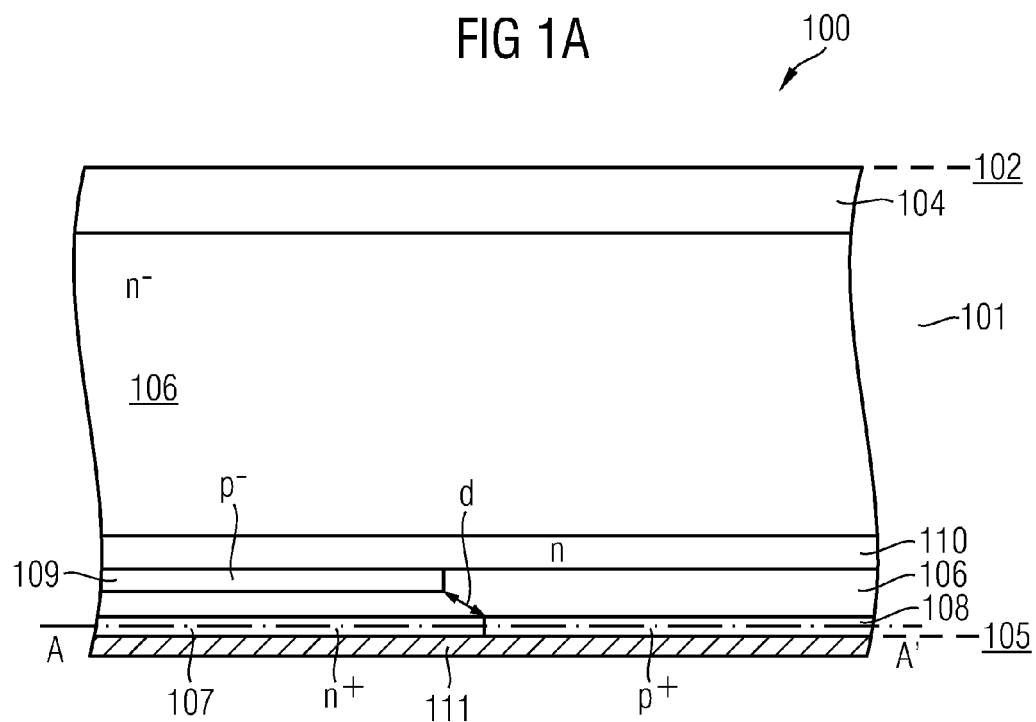
FIG. 1A is a schematic cross-section of an RC IGBT including a floating p⁻-type semiconductor zone for improving the trade-off between the electrical characteristics in a diode mode and in a transistor mode.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "n⁻" means a doping concentration which is less than the doping concentration of an "n"-doping region while an "n⁺"-doping region has a larger doping concentration than the "n"-doping region. Doping regions of the same relative doping concentration may or may not have the same absolute doping concentration. For example, two different n⁺-doped regions can have different absolute doping concentrations. The same applies, for example, to an n⁻-doped and a p⁺-doped region. In the embodiments described below, a conductivity type of the illustrated semiconductor regions is denoted n-type or p-type, in more detail one of n⁻-type, n-type, n⁺-type, p⁻-type, p-type and p⁺-type. In each of the illustrated embodiments, the conductivity type of the illustrated semiconductor regions may be vice versa. In other words, in an alternative embodiment to any one of the embodiments described below, an illustrated p-type region may be n-type and an illustrated n-type region may be p-type.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

FIG. 1A illustrates a cross-section of a part of an RC IGBT device 100 according to an embodiment. The semiconductor device 100 includes a semiconductor body 101, e.g. a semiconductor substrate including none, one or a plurality of semiconductor layers thereon. As an example, the semiconductor substrate includes silicon.

An emitter side 102 of the semiconductor body 101, e.g. a first side, includes IGBT cells 104. The IGBT cells 104 are illustrated in a simplified manner and include any suitable arrangement of dielectric material(s), semiconductor material(s) and conductive material(s) configured as emitter and gate of an IGBT.

Between the emitter side 102 and a collector side 105, e.g. a second side, an type drift zone 106 is arranged. The n$^-$-type drift zone 106 may be a part of the semiconductor body 101.

An n$^+$-type region 107 and a p$^+$-type region 108 are subsequently arranged along a lateral direction×parallel to the collector side 105. The n$^+$-type region 107 acts as an emitter in a diode mode of the RC IGBT 100. The p$^+$-type region 108 acts as an emitter in an IGBT mode of the RC IGBT 100. An electrode 111 including a conductive material, e.g. a metal, a metal alloy or a combination thereof, is electrically coupled to both the p$^+$-type region 108 and the n$^+$-type region 107.

A p$^-$-type semiconductor region 109 is arranged above the n$^+$-type emitter region 107 and at least partly covers the n$^+$-type emitter region 107. According to the embodiment illustrated in FIG. 1, the p$^-$-type semiconductor region 109 covers a part of the n$^+$-type emitter region 107 and is absent in an area above the p$^+$-type emitter region 108. According to another embodiment, the p$^-$-type semiconductor region 109 fully covers the n$^+$-type emitter region 107 and is absent in an area above the p$^+$-type emitter region 108. According to yet another embodiment, the p$^-$-type semiconductor region 109 at least partly covers the n$^+$-type emitter region 107 and partly covers an area above the p$^+$-type emitter region 108. The coverage ratio of the n$^+$-type emitter region 107 and p$^+$-type emitter region 108 may vary with regard to an arrangement of a plurality of n$^+$-type emitter regions 107 and p$^+$-type emitter regions 108. The p$^-$-type semiconductor region 109 and the p$^+$-type emitter region 108 are spaced apart from each other and a shortest distance between the p$^-$-type semiconductor region 109 and the p$^+$-type emitter region 180 is termed d and satisfies d>0 µm. In other words, the p$^-$-type semiconductor region 109 is electrically floating. As an example, the p$^-$-type semiconductor region 109 may be fully surrounded by n-type semiconductor material.

An n-type field stop zone 110 is arranged between the n$^-$-type drift zone 106 and the p$^-$-type semiconductor region 109. The n-type field stop zone 110 adjoins the p$^-$-type semiconductor region 109 and covers the n$^+$-type region 107 and the p$^+$-type region 108.

Figure 1B:
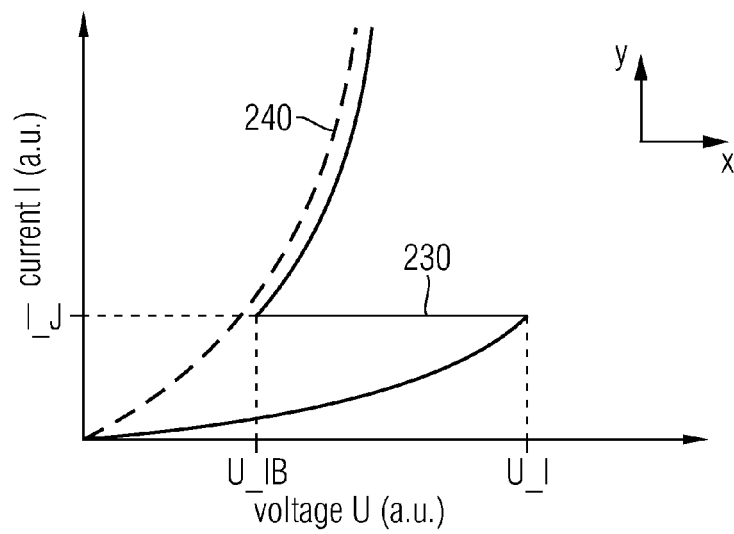
FIG. 1B is a schematic illustration of different current voltage characteristics of an RC IGBT.

The p$^-$-type semiconductor region 109 allows to improve a trade-off between the electrical characteristics in a diode mode and an IGBT mode. In an RC IGBT without the p$^-$-type semiconductor region 109, injection of holes from the p$^+$-type emitter region 108 into the n$^-$-type drift zone 106, i.e. onset of bipolar current flow between the emitter side 102 and the collector side 105, requires a forward-biased junction between the p$^+$-type emitter region 108 and the n$^-$-type drift zone 106. This junction may be forward-biased by a resistive voltage drop by electrons flowing through the n$^-$-type drift zone 106 to the n$^+$-type emitter region 107. A decrease of lateral dimensions of the p$^+$-type emitter region 108 may lead to an increase of an electron current density required to forward-bias the junction between the p$^+$-type emitter region 108 and the n$^-$-type drift zone 106. This current/voltage (IV) behavior may be accompanied by a characteristic in the IV behavior called "nose" herein that is illustrated as curve 230 in the schematic graph of FIG. 1B. Curve 230 illustrated in FIG. 1B is one example of an IV characteristic for an RC IGBT including a pattern of successively arranged p$^+$-type emitter regions and n$^+$-type emitter regions with typical lateral dimensions of less than 5 times the thickness of the drift region and lacking the p$^-$-type semiconductor region 109. A unipolar current flows up to a current I_J associated with a voltage U_J. For currents larger than I_J, the p$^+$-type emitter region gets forward-biased and triggers bipolar current flow. This leads to a snap back of the voltage up to a value U_JB<U_J. A counter measure for reducing or avoiding the nose or snap back while maintaining the dimensions of the p$^+$-type and the n$^+$-type emitter regions lies in the arrangement of the p$^-$-type semiconductor region 109. Emission of holes from the p$^-$-type semiconductor region 109 occurs at low current densities, i.e. at currents I<I_J, by operating the pn junction between the floating p$^-$-type semiconductor region 109 and the surrounding n-type semiconductor material in avalanche or due to punch-through from the floating p$^-$-type semiconductor region 109 to the p$^+$-type emitter region 108. Thus, the arrangement of the p$^-$-type semiconductor region 109 allows to prevent or reduce the so-called nose characteristic in the IV curve of the RC IGBT in the IGBT mode. As an example, arrangement of the p$^-$-type semiconductor region 109 may lead to an IV curve as illustrated by curve 240 in FIG. 1B.

Figure 1C:
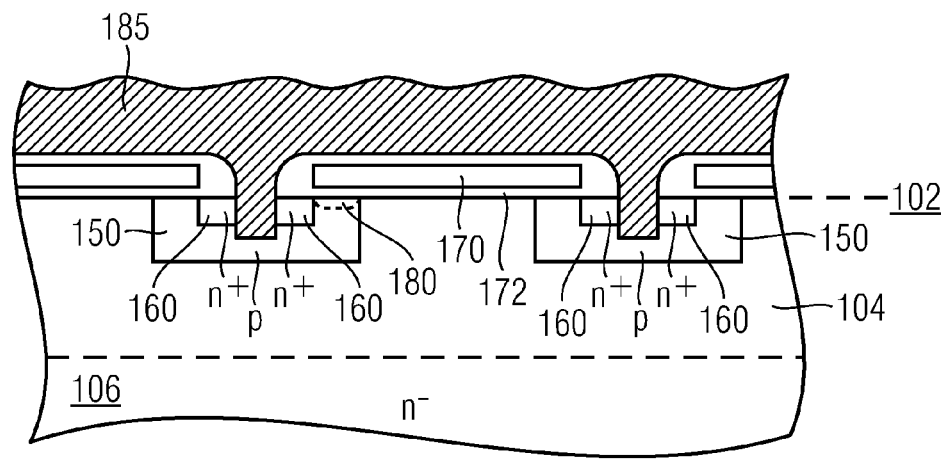
FIG. 1C illustrates one example of an arrangement of semiconductor zones constituting the IGBT cells illustrated in FIG. 1A.

FIG. 1C illustrates one example of arrangement of semiconductor zones constituting the IGBT cells 104 illustrated in FIG. 1A. The IGBT cells 104 include a p-type body region 150 in the semiconductor body 101. The p-type body region 150 adjoins the emitter side 102. An n$^+$-type source region 160 is formed in the p-type body region 150. The p-type body region 150 and the n$^+$-type source region 160 are electrically coupled to a contact structure 185 at the emitter side 102. Between the p-type body region 150 and the contact structure 185 a p$^+$-type contact zone may be arranged (not illustrated in FIG. 1C).

The conductivity in a channel region 180 formed in the p-type body region 150 at the emitter side 102 can be controlled via a voltage applied to a gate electrode 170. A gate dielectric 172 is arranged between the gate electrode 170 and the channel region 180.

The arrangement of semiconductor zones constituting the IGBT cells 104 as illustrated in FIG. 1C is one example. Other arrangements may substitute the specific arrangement shown in FIG. 1C.

Figure 2:
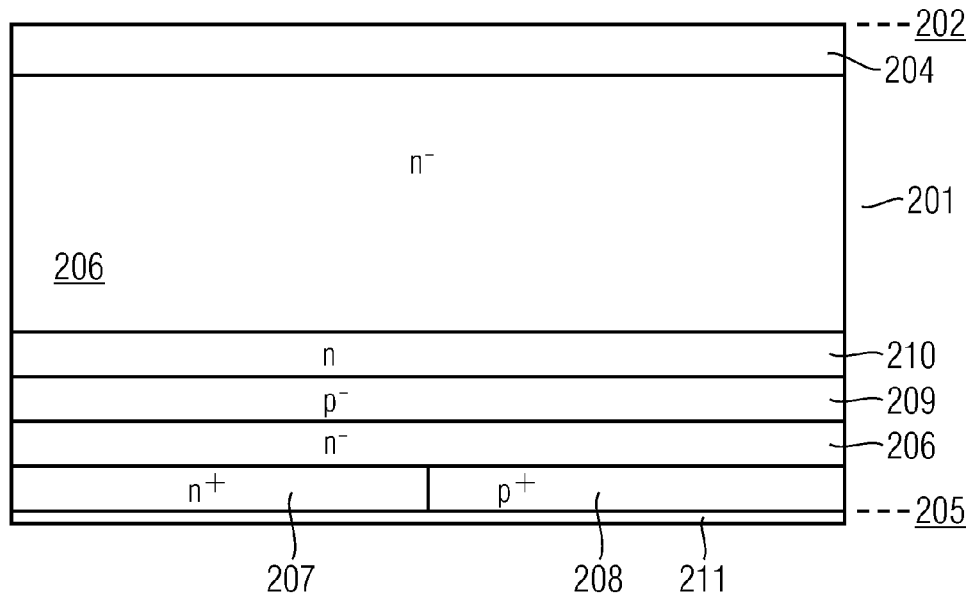
FIGS. 2 to 6 are schematic cross-sections of RC IGBTs including different designs of a floating p⁻-type semiconductor zone for improving the trade-off between the electrical characteristics in a diode mode and in a transistor mode.

FIG. 2 illustrates a cross-section of a part of an RC IGBT device 200 according to another embodiment. Similar to the RC IGBT 100 illustrated in FIG. 1A, the RC IGBT device 200 includes a semiconductor body 201 having an emitter side 202 and a collector side 205, IGBT cells 204, an n$^-$-type drift zone 206, an n$^+$-type region 207 acting as an emitter in a diode mode of the RC IGBT 200, a p$^+$-type region 208 acting as an emitter in an IGBT mode of the RC IGBT 200, an n-type field stop zone 210 and an electrode 211.

The RC IGBT device 200 further includes a continuous p$^-$-type semiconductor region 209 fully covering both the n$^+$-type region 207 and the p$^+$-type region 208. As an example, the p$^-$-type semiconductor region 209 may be formed without a mask or by using a mask common to formation of the n-type field stop zone 210 and the p⁻-type semiconductor region 209, thereby contributing to a reduction of manufacturing costs. A semiconductor region between the p⁻-type semiconductor region 209 and the emitter regions 208, 209 may include a doping similar to the n⁻-type drift zone 206. When measuring the forward characteristic of the RC IGBT device 200 in a diode mode, depending on the doping level of the p⁻-type semiconductor region 209 a nose may appear in the IV characteristic due to a reverse operation of the junction between the n-type field stop zone 210 and the p⁻-type semiconductor region 209. The nose characteristic may be adjusted by a thickness and doping of the p⁻-type semiconductor region 209, for example. As an example, assuming a thickness in a range of 100 nm to 500 nm and a doping in a range of $10^{14}$ cm⁻³ to $10^{15}$ cm⁻³, a punch-through voltage amounts to values as small as 0.8 mV to 0.2 V resulting in a nose characteristic that is negligible or almost negligible. Further it is to be noted that flooding the p⁻-type semiconductor region 209 with excess carriers occurs after onset of forward diode operation.

Figure 3:
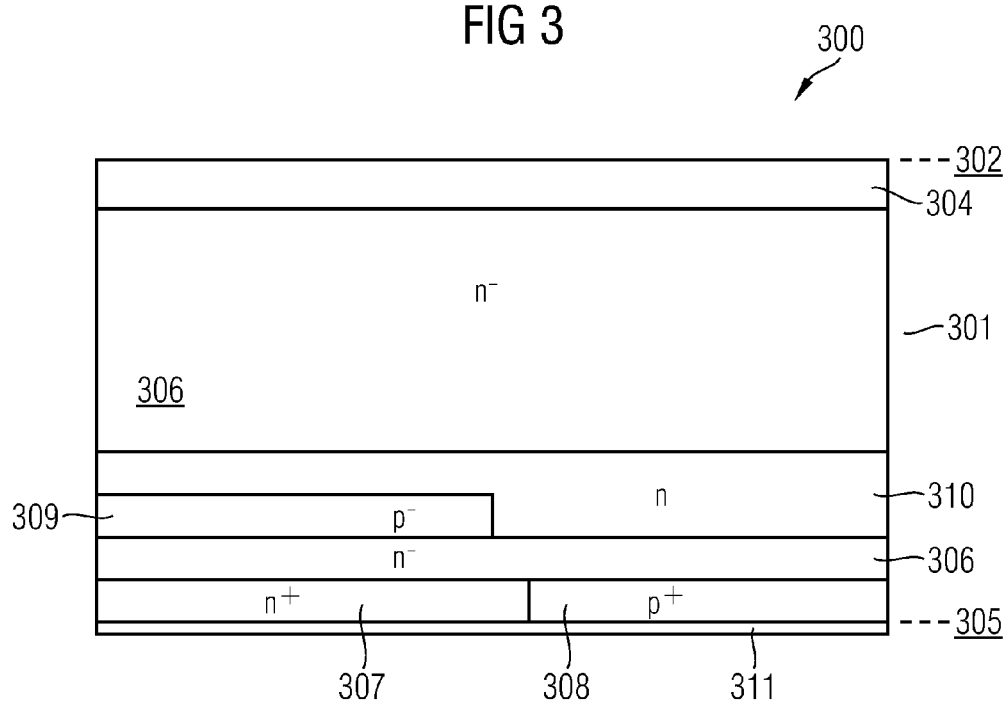

FIG. 3 illustrates a cross-section of a part of an RC IGBT device 300 according to another embodiment. Similar to the RC IGBT 200 illustrated in FIG. 2, the RC IGBT device 300 includes a semiconductor body 301 having an emitter side 302 and a collector side 305, IGBT cells 304, an n⁻-type drift zone 306, an n⁺-type region 307 acting as an emitter in a diode mode of the RC IGBT 300, a p⁺-type region 308 acting as an emitter in an IGBT mode of the RC IGBT 300, an electrode 311 and an n-type field stop zone 310.

The RC IGBT device 300 further includes a p⁻-type semiconductor region 309 partly covering the n⁺-type region 307. The p⁻-type semiconductor region 309 is absent, i.e. not formed, in an area above the p⁺-type region 308. Opening the p⁻-type semiconductor region 309 above the p⁺-type region 308 allows to avoid or reduce a nose in the IV characteristic of the diode mode that may appear in the embodiment as illustrated in FIG. 2 as described above.

Figure 4:
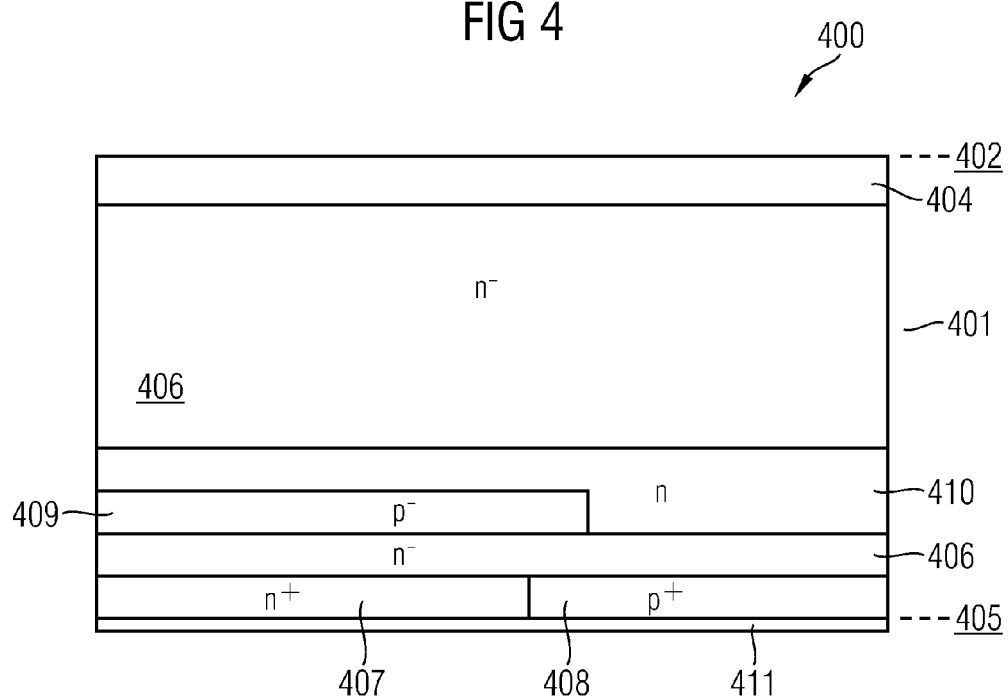

FIG. 4 illustrates a cross-section of a part of an RC IGBT device 400 according to another embodiment. Similar to the RC IGBT 300 illustrated in FIG. 3, the RC IGBT device 400 includes a semiconductor body 401 having an emitter side 402 and collector side 405, IGBT cells 404, an n⁻-type drift zone 406, an n⁺-type region 407 acting as an emitter in a diode mode of the RC IGBT 400, a p⁺-type region 408 acting as an emitter in an IGBT mode of the RC IGBT 400, an electrode 411 and an n-type field stop zone 410.

The RC IGBT device 400 further includes a p⁻-type semiconductor region 409 fully covering the n⁺-type region 407 and partly covering the p⁺-type region 408. Hence, a rate of coverage of both the p⁺-type region 408 and the n⁺-type region 407 is larger in the RC IGBT device 400 than in the RC IGBT device 300 illustrated in FIG. 3. Since an overall area of the p⁻-type semiconductor region 409 may be adjusted independent of the overall area of the n⁺-type region 407, the overall area of the p⁻-type semiconductor region 409 may be substantially larger than an overall area of the p⁺-type region 408. This allows avoiding a nose in the IV characteristic of the IGBT mode. Further, since the p⁻-type semiconductor region 409 is absent in at least a part of the area above the p⁺-type region 408 acting as an emitter in an IGBT mode, a nose in the IV characteristic of the diode mode may be prevented. When a plurality of p⁺-type regions 408 are arranged at the collector side 405, a first part of the p⁺-type regions 408 may be fully covered by the p⁻-type semiconductor region 409 provided that a second part of the p⁺-type regions 408 are partly covered or not covered.

Figure 5:
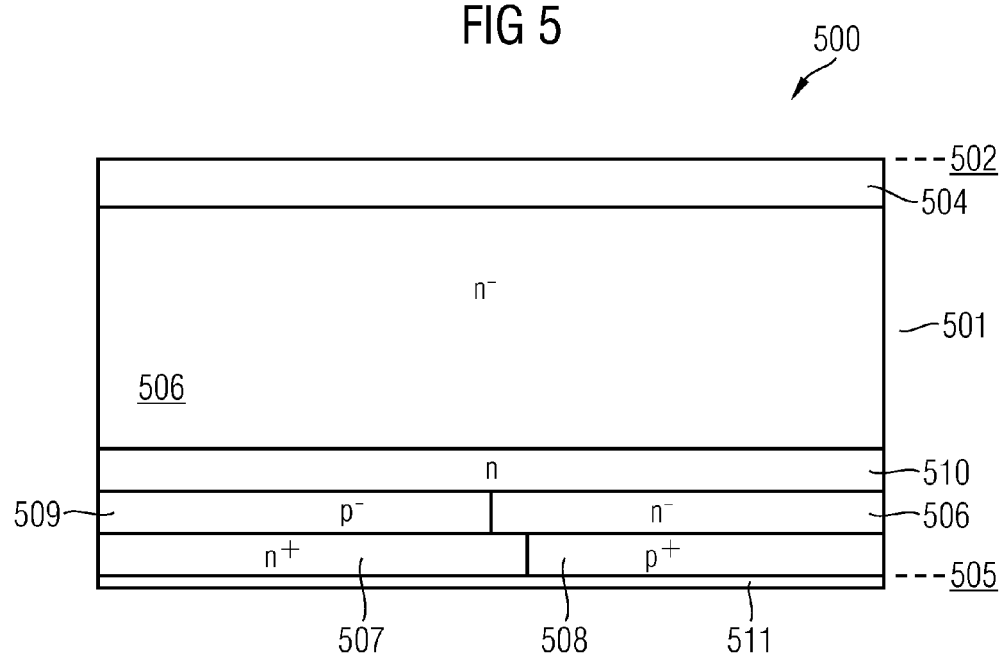

FIG. 5 illustrates a cross-section of a part of an RC IGBT device 500 according to another embodiment. Similar to the RC IGBT 300 illustrated in FIG. 3, the RC IGBT device 500 includes a semiconductor body 501 having an emitter side 502 and collector side 505, IGBT cells 504, an n⁻-type drift zone 506, an n⁺-type region 507 acting as an emitter in a diode mode of the RC IGBT 500, a p⁺-type region 508 acting as an emitter in an IGBT mode of the RC IGBT 500, an electrode 511 and an n-type field stop zone 510.

The RC IGBT device 500 further includes a p⁻-type semiconductor region 509 partly covering the n⁺-type region 507. The p⁻-type semiconductor region 509 is absent, i.e. not formed, in an area above the p⁺-type region 508. Opening the p⁻-type semiconductor region 509 above the p⁺-type region 508 allows to avoid or reduce a nose in the IV characteristic of the diode mode that may appear in the embodiment as illustrated in FIG. 2 as described above. A bottom side of the p⁻-type semiconductor region 509 adjoins the n⁺-type region 507 acting as an emitter in a diode mode of the RC IGBT 500. The embodiment illustrated in FIG. 5 may be beneficial with regard to manufacturing aspects since the p⁻-type semiconductor region 509 may be formed by comparatively shallow ion implantation.

Figure 6:
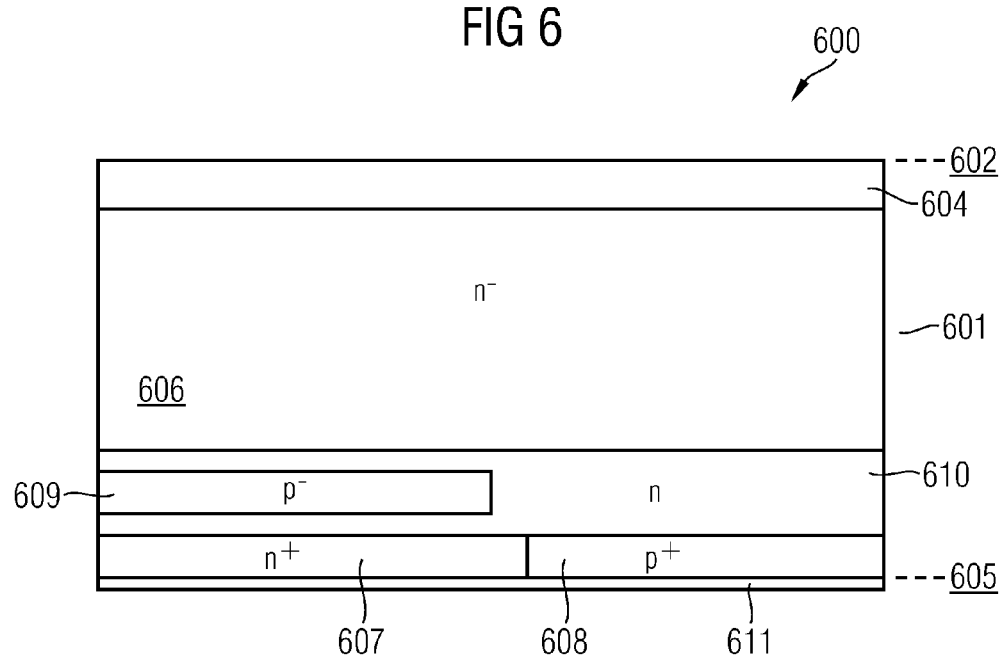

FIG. 6 illustrates a cross-section of a part of an RC IGBT device 600 according to another embodiment. Similar to the RC IGBT 300 illustrated in FIG. 3, the RC IGBT device 600 includes a semiconductor body 601 having an emitter side 602 and collector side 605, IGBT cells 604, an n⁻-type drift zone 606, an n⁺-type region 607 acting as an emitter in a diode mode of the RC IGBT 600, a p⁺-type region 608 acting as an emitter in an IGBT mode of the RC IGBT 600, an electrode 611 and an n-type field stop zone 610.

The RC IGBT device 600 further includes a p⁻-type semiconductor region 609 partly covering the n⁺-type region 607. The p⁻-type semiconductor region 609 is absent, i.e. not formed, in an area above the p⁺-type region 608. Opening the p⁻-type semiconductor region 609 above the p⁺-type region 608 allows avoiding or reducing a nose in the IV characteristic of the diode mode that may appear in an embodiment as illustrated in FIG. 2 as described above. The p⁻-type semiconductor region 609 is embedded in the n-type field stop zone 610. A bottom side of the n-type field stop zone 610 adjoins both the p⁺-type region 608 acting as an emitter in an IGBT mode of the RC IGBT 600 and the n⁺-type region 607 acting as an emitter in a diode mode of the RC IGBT 600. The other examples for the design of the p⁻-type semiconductor region which are described above can be embedded in the field stop layer according to FIG. 6.

Figure 7A:
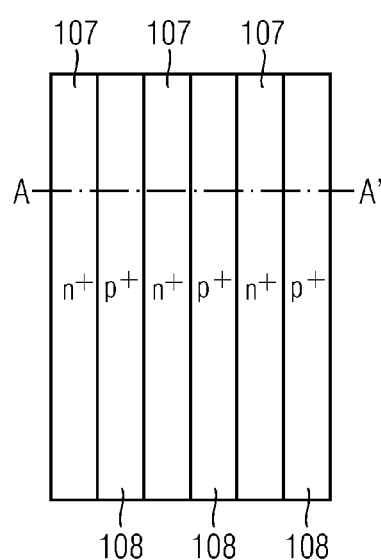
FIGS. 7A to 7C illustrate examples of designs of p⁺-type regions acting as an emitter in an IGBT mode and n⁺-type regions acting as an emitter in a diode mode of an RC IGBT.
Figure 7B:
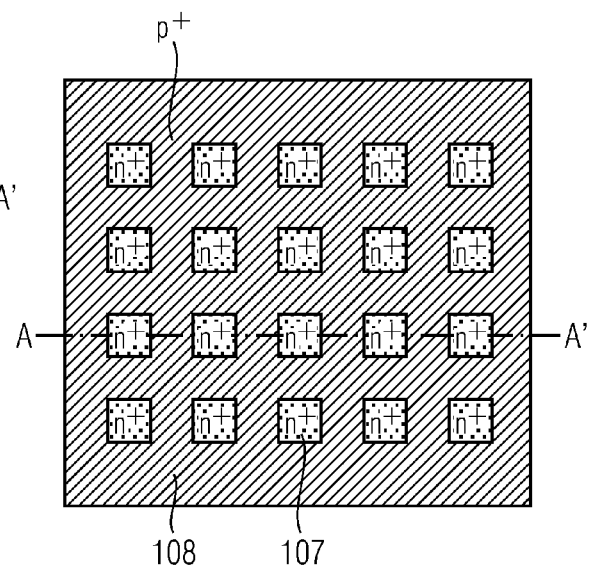
Figure 7C:
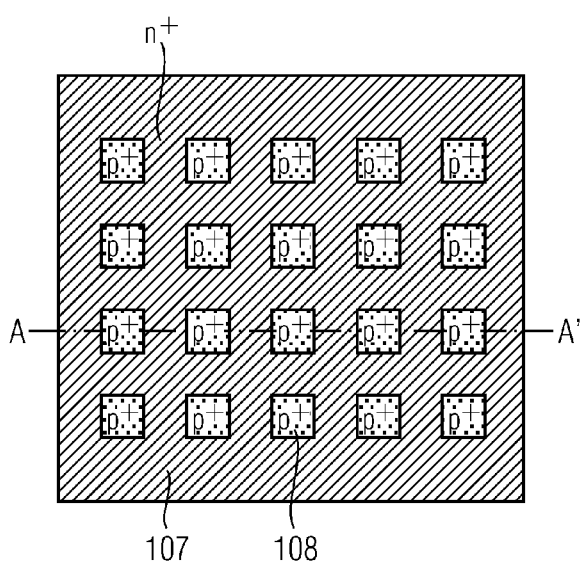

A typical design for the n⁺-type region 107 of FIG. 1A (as well as the n⁺-type regions 207, 307, 407, 507, 607 illustrated in FIGS. 2 to 6) and the p⁺-type region 108 of FIG. 1A (as well as the p⁺-type regions 208, 308, 408, 508, 608 illustrated in FIGS. 2 to 6) is a stripe design as schematically illustrated in FIG. 7A with reference to a cut line A-A' of FIG. 1A. A further example for a design of the n⁺-type region 107 of FIG. 1A (as well as the n⁺-type regions 207, 307, 407, 507, 607 illustrated in FIGS. 2 to 6) and the p⁺-type region 108 of FIG. 1A (as well as the p⁺-type regions 208, 308, 408, 508, 608 illustrated in FIGS. 2 to 6) is a design in which each p⁺-type region 108 is surrounded by an n⁺-type region or vice versa as illustrated in FIGS. 7B and 7C. In such a design, the n⁺-type regions 107 of FIG. 7B and/or the p⁺-type regions 108 of FIG. 7C may be of square, rectangular, circular shape or a combination thereof.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A reverse conducting semiconductor device, comprising:
   a drift zone of a first conductivity type arranged between a first side and a second side of a semiconductor body;
   a first region of the first conductivity type and a second region of a second conductivity type subsequently arranged along a first direction parallel to the second side;
   an electrode at the second side adjoining the first and second regions;
   a third region of the second conductivity type arranged between the drift zone and the first region, and wherein the third region is spaced apart from the second region and from the second side, and from the first region by a fourth semiconductor region of the first conductivity type,
   wherein a doping concentration of the drift zone and the fourth semiconductor region is less than a doping concentration of the first region.

2. The reverse conducting semiconductor device of claim 1, wherein the reverse conducting semiconductor device is a reverse conducting IGBT, the first side is an emitter side and the second side is a collector side.

3. The reverse conducting semiconductor device of claim 1, wherein an average concentration of doping of the fourth semiconductor region along a direction perpendicular to the second side is in a range of $10^{14}$ cm-3 to $10^{16}$ cm-3.

4. The reverse conducting semiconductor device of claim 1, wherein the third semiconductor region is an electrically floating semiconductor region.

5. The reverse conducting semiconductor device of claim 1, wherein the third semiconductor region is fully surrounded by semiconductor material of the first conductivity type.

6. The reverse conducting semiconductor device of claim 1, wherein the third semiconductor region covers the first and second semiconductor regions and has a thickness in a range of 50 nm to 5 µm.

7. The reverse conducting semiconductor device of claim 1, wherein an average doping concentration of the third semiconductor region along a vertical direction perpendicular to the second side is in a range of $10^{14}$ cm-3 to $10^{16}$ cm-3.

8. The reverse conducting semiconductor device of claim 1, wherein the third semiconductor region fully covers the first and second semiconductor regions.

9. The reverse conducting semiconductor device of claim 1, wherein the third semiconductor region covers at least partly the first semiconductor region and is absent in an area above the second semiconductor region.

10. The reverse conducting semiconductor device of claim 1, wherein the third semiconductor region fully covers the first semiconductor region and partly covers the second semiconductor region.

11. The reverse conducting semiconductor device of claim 1, wherein the third semiconductor region is contiguous and includes apertures, wherein an aperture area ratio is in a range of 0% to 90%.

12. The reverse conducting semiconductor device of claim 1, wherein the third semiconductor region adjoins the first semiconductor region.

13. The reverse conducting semiconductor device of claim 1, further comprising a plurality of the first and second semiconductor regions alternately arranged along the lateral direction, wherein a maximum lateral dimension of each one of the second semiconductor regions is smaller than 5 times of the thickness of the drift zone.

14. The reverse conducting semiconductor device of claim 1, wherein a thickness of the fourth semiconductor region is in a range of 50 nm to 5 µm.

15. The reverse conducting semiconductor device of claim 1, further comprising a field stop zone of the first conductivity type between the drift zone and the third semiconductor region, wherein the field stop zone has an average doping concentration along a vertical direction perpendicular to the second side that is larger than an average doping concentration of the drift zone along the vertical direction.

16. The reverse conducting semiconductor device of claim 15, wherein the third semiconductor region is embedded in the field stop zone.

17. The reverse conducting semiconductor device of claim 15, wherein the field stop zone adjoins the second semiconductor region.

18. A reverse conducting insulated gate bipolar transistor, comprising:
   a drift zone of a first conductivity type arranged between an emitter side and a collector side of a semiconductor body;
   a first emitter region of the first conductivity type and a second emitter region of a second conductivity type subsequently arranged along a first direction parallel to the collector-side;
   an electrode at the collector side adjoining the first and second emitter regions;
   a third region of the second conductivity type arranged between the drift zone and the first region, and wherein the third region is spaced apart from the second region and from the second side, and from the first region by a fourth semiconductor region of the first conductivity type,
   wherein a doping concentration of the drift zone and the fourth semiconductor region is less than a doping concentration of the first region.

19. The reverse conducting insulated gate bipolar transistor of claim 18, wherein the third semiconductor region is an electrically floating semiconductor region.

20. The reverse conducting insulated gate bipolar transistor of claim 18, wherein the third semiconductor region is fully surrounded by semiconductor material of the first conductivity type.

21. The reverse conducting semiconductor device of claim 18, wherein a thickness of the fourth semiconductor region is in a range of 50 nm to 5 µm.

* * * * *